United States Patent [19]

Nakajima et al.

[11] Patent Number: 5,252,703
[45] Date of Patent: Oct. 12, 1993

[54] POLYIMIDOSILOXANE RESIN AND COMPOSITION THEREOF AND METHOD OF APPLYING SAME

[75] Inventors: Kohei Nakajima; Hiroshi Yasuno; Mitsushi Taguchi, all of Ichihara, Japan

[73] Assignee: Ube Industries, Ltd., Yamaguchi, Japan

[21] Appl. No.: 706,688

[22] Filed: May 29, 1991

[30] Foreign Application Priority Data

Jun. 1, 1990 [JP] Japan .................. 2-141516
Mar. 26, 1991 [JP] Japan .................. 3-132371

[51] Int. Cl.$^5$ .................. C08G 69/48; C08L 63/00; C08L 79/08
[52] U.S. Cl. .................. 525/423; 525/476; 525/533; 528/26; 528/28; 528/38
[58] Field of Search .................. 528/26, 28, 38; 525/423, 476, 533

[56] References Cited

U.S. PATENT DOCUMENTS

| | | | |
|---|---|---|---|
| 4,410,664 | 10/1983 | Lee | 528/350 |
| 4,734,464 | 3/1988 | Biensan | 528/26 |
| 4,759,987 | 7/1988 | Nizobe et al. | 524/205 |
| 4,778,872 | 10/1988 | Sasaki et al. | 528/187 |
| 4,956,437 | 9/1990 | Lee | 528/26 |
| 5,041,513 | 8/1991 | Okinoshima et al. | 528/38 |

Primary Examiner—John C. Bleutge
Assistant Examiner—Margaret W. Glass
Attorney, Agent, or Firm—Finnegan, Henderson, Farabow, Garrett & Dunner

[57] ABSTRACT

A polyimidosiloxane material useful for forming, on a flexible substrate material, a flexible protective coating layer with a high heat resistance, electrical insulating property and curl-resistance, comprises a polymerization-imidization product of an aromatic tetracarboxylic acid component comprising, as a principal ingredient, 2,3,3',4'-biphenyltetracarboxylic dianhydride with a diamine component comprising, as a principal ingredient, a diaminopolysiloxane compound of the formula (I)

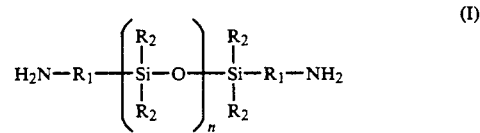

wherein $R_1$ is a divalent hydrocarbon residue, $R_2$ is an $C_{1-3}$ alkyl or phenyl group, n is an integer of 3 to 30, and is preferably used, optionally together with an epoxy resin, in the form of a solution or dispersion in an organic solvent to coat a flexible substrate material, for example, a flexible circuit element, therewith.

18 Claims, No Drawings

POLYIMIDOSILOXANE RESIN AND COMPOSITION THEREOF AND METHOD OF APPLYING SAME

BACKGROUND OF THE INVENTION

1) Field of the Invention

The present invention relates to a polyimidosiloxane resin, a composition thereof, and a method of applying same. More particularly, the present invention relates to a polyimidosiloxane resin having a high solvent solubility and an excellent heat resistance, and capable of forming shaped articles and coating films with a satisfactory insulating property, a high flexibility and a satisfactory mechanical strength, a polyimidosiloxane composition comprising the polyimidosiloxane resin, and optionally another resinous material, which are dissolved or dispersed in an organic solvent, and capable of forming coating film having a high resistance to curling, a high flexibility and a satisfactory mechanical strength of a shaped article or a flexible circuit board, and a method of applying the polyimidosiloxane composition to form the coating layer on the shaped article or flexible circuit board.

2) Description of the Related Art

It is known that conventional aromatic imide polymers can be used for forming electrical insulating protective film layers on shaped articles. For example, the aromatic imide polymers are utilized to form electrical insulating film layers on solid electric elements, passivation film layers, and interlaminar electrical insulating film layers of semiconductive integrated circuits and of flexible circuit boards.

Generally, the conventional imide polymers have a very poor solubility in organic solvents, and therefore, the protective coating film layers for the electronic elements, for example, a circuit element comprising a copper foil circuit adhered to a flexible substrate through an adhesive layer, are usually formed by coating the electronic element surfaces with a solution of a polyimide precursor consisting of an aromatic polyamic acid in an organic solvent, drying the coated precursor solution layer, and heat-treating the dried precursor layer on the electronic element at a high temperature of from 250° C. to 400° C. for a long time of from 60 to 180 minutes, to imidize the polyamic acid into a corresponding polyimide. This heat treatment at a high temperature for a long time causes a thermal deterioration of the copper foil circuit and the adhesive layer, and the imidization of the polyamic acid causes the polyamic acid to be dehydrated and the resultant cured polyimide layer to be shrunk and thus curled. Further, the dehydration causes a number of fine pores or voids to be formed in the resultant polyimide layer, and thus the porous polyimide layer exhibits a lower insulating property and a reduced protection of the electronic element.

Japanese Examined Patent Publication No. 57-41491 discloses an aromatic imide polymer soluble in an organic solvent. This aromatic imide polymer is, however, disadvantageous in that the bonding (close adhesive) property of the imide polymer to substrate materials, for example, silicon wafers, glass plates and flexible substrate plates, is unsatisfactory, and therefore, the surfaces of the substrate materials to be bonded must be pretreated with a bonding-promotion agent.

To eliminate the above-mentioned disadvantages, U.S. Pat. No. 4,520,075 and Japanese Unexamined Patent Publication No. 58-13,631 disclose a polyimidosiloxane precursor prepared by employing a diaminopolysilicone compound as a diamino component.

This type of polyimidosiloxane precursor, however, is also disadvantageous in that a heat treatment at a high temperature must be carried out to convert the precursor to the corresponding polyimidosiloxane.

Further, U.S. Pat. Nos. 4,586,997, 4,670,497, 4,968,757, and 4,672,099 and Japanese Unexamined Patent Publication Nos. 63-225,629, and 1-121,325 disclose solvent-soluble polyimidosiloxanes. Some of the polyimidosiloxanes have a disadvantage such that the polymers can be produced only by a relatively large number of steps, and thus the production time is very long. Also, some of the polyimidosiloxanes do not include aromatic diamine as a diamine component, and thus have a poor heat resistance. Further, some of the polyimidosiloxanes exhibit a disadvantage such that, when a solution of the polyimidosiloxane is coated on a flexible substrate plate, for example, copper-coated plate, and the resultant solution layer is dried, the substrate plate is significantly curled.

It is also known that an epoxy resin can be utilized to form a protective coating film layer on a surface of an electric circuit element, for example, a flexible circuit element or circuit element for TAB, by applying a solution of the epoxy resin in an organic solvent and drying and curing the resultant epoxy resin solution layer. The epoxy resin protective layer exhibits a satisfactory bonding property to the circuit element surface and a high heat resistance, but is disadvantageous in that, since the cured epoxy resin layer has a high stiffness and a poor flexibility, the circuit element coated with the cured epoxy resin layer is significantly curled, and sometimes a large number of fine cracks are created in the cured epoxy resin layer.

SUMMARY OF THE INVENTION

An object of the present invention is to provide a polyimidosiloxane resin having a high solubility in organic solvents, a high heat resistance, and capable of forming, on a flexible substrate material, a protective coating film layer having a satisfactory electrical insulating property and flexibility, without causing a curling of the substrate material, a composition comprising the polyimidosiloxane resin, and optionally an epoxy resin, and a method of applying the polyimidosiloxane composition to a flexible substrate material to thus provide a polyimidosiloxane-coated flexible material.

The above-mentioned object can be attained by the polyimidosiloxane material of the present invention which comprises a polymerization-imidization product of:

(A) an aromatic tetracarboxylic acid component comprising:
  (a) 80 to 100 molar % of a principal acid ingredient consisting of at least one member selected from 2,3,3′,4′-biphenyltetracarboxylic acid and dianhydride and esters of the above-mentioned acid, and
  (b) 0 to 20 molar % of an additional acid ingredient consisting of at least one member selected from aromatic tetracarboxylic acids different from 2,3,3′,4′-biphenyltetracarboxylic acid, and dianhydrides and esters of the above-mentioned acids, with (B) a diamine component comprising:

(c) 45 to 90 molar % of a principal diamine ingredient consisting of at least one diaminopolysiloxane compound of the formula (I):

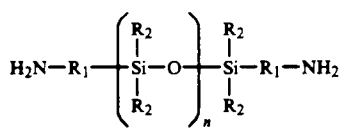

wherein $R_1$ represents a divalent hydrocarbon residue, $R_2$ represents a member selected from alkyl groups having 1 to 3 carbon atoms and phenyl group, and n represents an integer of from 3 to 30, and (d) 10 to 55 molar % of an additional diamine ingredient consisting of at least one aromatic diamine compound different from the diaminopolysiloxane compound of the formula (I).

The polyimidosiloxane composition of the present invention comprises the polyimidosiloxane material as mentioned above, which materials are uniformly dissolved in an organic solvent having a boiling point of from 100° C. to 250° C.

The method of the present invention for applying the polyimidosiloxane composition as mentioned above to a flexible substrate material, comprises the steps of coating a surface of a flexible substrate material with the polyimidosiloxane composition; and drying the resultant polyimidosiloxane composition layer at a temperature of from 50° C. to 280° C., to evaporate away the organic solvent and form a protective coating layer on the flexible substrate material.

DESCRIPTION OF THE PREFERRED EMBODIMENTS

The polyimidosiloxane resin of the present invention comprises a polymerization-imidization product of a specific aromatic tetracarboxylic acid component (A) with a specific diamine components as defined above.

The aromatic tetracarboxylic acid component (A) comprises:

(a) 80 to 100 molar %, preferably 85 to 100 molar %, of a principal acid ingredient consisting of at least one member selected from 2,3,3',4'-biphenyltetracarboxylic acid and dianhydride and esters of the above-mentioned acid, and (b) 0 to 20 molar %, preferably 0 to 15 molar % of an additional acid ingredient consisting of at least one member selected from aromatic tetracarboxylic acids different from 2,3,3',4'-biphenyltetracarboxylic acid and dianhydrides and esters of the above-mentioned different acids.

The additional acid ingredient (b) in the aromatic tetracarboxylic acid component (A) preferably comprises at least one member selected from 3,3',4,4'-biphenyltetracarboxylic acid, 3,3',4,4'-benzophenonetetracarboxylic acid, 3,3',4,4'-bi-phenylether-tetracarboxylic acid, pyromellitic acid and dianhydrides and esters of the above-mentioned acids. The diamine component (B) comprises:

(c) 45 to 90 molar %, preferably 45 to 80 molar %, more preferably 45 to 75 molar %, still more preferably 50 to 75 molar %, of a principal diamine ingredient consisting of at least one diaminopolysiloxane compound of the formula (I)

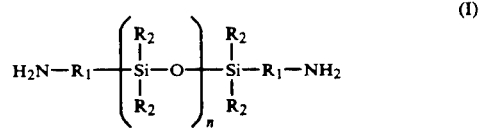

wherein $R_1$ represents a divalent hydrocarbon residue, preferably a polymethylene group having 2 to 6 carbon atoms, preferably 3 to 5 carbon atoms or a phenylene group; $R_2$ represents a member selected from alkyl groups having 1 to 3 carbon atoms, for example, methyl, ethyl and propyl groups, and a phenyl group; and n represents an integer of 3 to 30, preferably 4 to 20, more preferably 5 to 15; and (d) 10 to 55 molar %, preferably 20 to molar %, more preferably 25 to 55 molar %, still more preferably 25 to 50 molar % of an additional diamine ingredient consisting of at least one aromatic diamine compound different from the diaminopolysiloxane compound of the formula (I).

The diaminopolysiloxane compound of the formula (I) for the principal diamine ingredient (c) is preferably selected from those of the formulae:

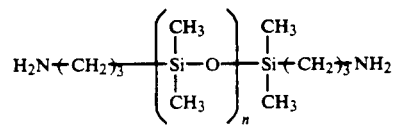

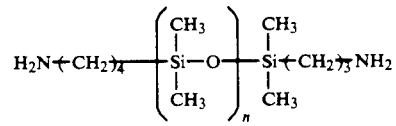

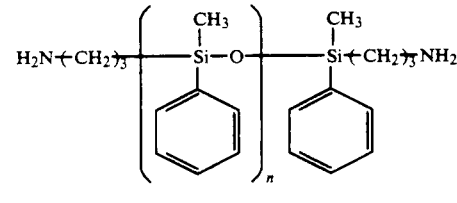

and

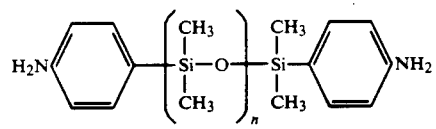

wherein n is as defined above, preferably is an integer of 4 to 20.

If the content of the principal diaminopolysiloxane compound ingredient (c) in the diamine component (B) is less than 45 molar %, the resultant polyimidosiloxane resin exhibits an unsatisfactory solubility in an organic solvent, and the resultant coating, layer formed from the polyimidosiloxane resin on a flexible substrate material causes a significant curling of the flexible substrate material. Also, if the content of the principal diaminopolysiloxane compound ingredient (c) is more than 90%, the resultant polyimidosiloxane resin exhibits an unsatisfactory heat resistance and mechanical properties.

In an embodiment of the present invention, the additional diamine ingredient (d) in the diamine component (B) comprises 55 to 99.5 molar %, more preferably 60 to 99 molar %, of at least one aromatic diamine compound having a plurality, preferably 2 to 4, of benzene ring structures, and 0.5 to 45 molar %, more preferably 1 to 40 molar %, of at least one aromatic diamine compound having only one benzene ring structure, based on the total molar amount of the additional diamine ingredient (d).

The aromatic diamine compound having a plurality of benzene ring structures is preferably selected from aromatic diamine compounds having two benzene ring structures, for example, 4,4'-diaminodiphenylether, 4,4'-diaminodiphenylmethane, 4,4'-diaminodiphenylsulfon, o-tolidine and o-dianisidine; aromatic diamine compounds having three benzene ring structures, for example, 1,4-bis(4-aminophenoxy)benzene, and 1,4-bis(4-aminophenyl)benzene; and aromatic diamine compounds having four benzene ring structure, for example, bis[4-(4-aminophenoxy)phenyl]sulfon and 2,2-bis[4-(4-aminophenoxy)phenyl]propane.

Also, in the additional diamine ingredient (d), the aromatic diamine compound having only one benzene ring structure is preferably selected from p-phenylenediamine, m-phenylenediamine, 2,4-diaminotoluene, 3,5-diaminobenzoic acid, 2,6-diaminobenzoic acid and 3,5-diaminobenzyl acrylate.

In another embodiment of the present invention, the additional diamine ingredient (d) in the diamine component (B) comprises 0.5 to 25 molar %, preferably 1 to 20 molar %, more preferably 5 to 20 molar %, based on the total molar amount of the diamine component (B), of at least one diaminobenzoic acid and the balance consisting of at least one aromatic diamine compound having a plurality of benzene ring structure.

In this embodiment, the diaminobenzoic acid is preferably selected from 3,5-diaminobenzoic acid and 2,6-diaminobenzoic acid.

If the content of the diaminobenzoic acid in the additional diamine ingredient is less than 5 molar %, the resultant polyimidosiloxane resin sometimes exhibits a unsatisfactory activity when curing the epoxy resin. Also, if the content of the diaminobenzoic acid is more than 30 molar %, the resultant polyimidosiloxane resin sometimes exhibits an unsatisfactory solubility in the organic solvent.

Also, in this embodiment, the aromatic diamine compound having a plurality of benzene ring structures can be selected from those mentioned above, and is present preferably in an amount of 5 to 50 molar %, more preferably 10 to 45 molar %, based on the total molar amount of the diamine component (B).

In this embodiment, the additional diamine ingredient (d) in the diamine component (B) optionally further comprises 10 molar % or less based on the total molar amount of the additional diamine ingredient (d), of at least one aromatic diamine compound having only one benzene ring structure and different from diaminobenzoic acid.

The aromatic diamine compound having only one benzene ring structure and different from diaminobenzoic acid can be selected from those mentioned above.

The polymerization-imidization process for producing the polyimidosiloxane material can be carried out by preparing a reaction mixture comprising the aromatic tetracarboxylic acid component (A) and the diamine component (B) in substantially equal molar amounts, dissolving same in an organic polar solvent, and heating the mixture at a temperature of 120° C. or more to polymerize and imidize same in a single step.

In another process, the reaction mixture is heated at a temperature of 80° C. or less to prepare a polyamic acid (polyimide precursor), and the resultant polyamic acid is imidized by a customary imidization method, for example, a chemical imidization method or a high temperature imidization method, to provide a polyimidosiloxane material.

The organic solvent for the polymerization and imidization process preferably comprises at least one member selected from dialkyl sulfoxide compounds, for example, dimethylsulfoxide and diethylsulfoxide; dialkyl formamide compounds, for example, N,N-dimethylformamide, and N,N-diethylformamide; dialkylacetamide compounds, for example, N,N-dimethylacetamide and N,N-diethylacetamide; pyrrolidone compounds, for example, N-methyl-2-pyrrolidone, N-ethyl-2-pyrrolidone and N-vinyl-2-pyrrolidone; glyme compounds, for example, methyl diglyme and methyl triglyme; oxane compounds, for example, dioxane and trioxane; and other solvents, for example, hexamethylene phosphoramide, γ-butyrolacton, cyclohexanone, phenol, o-, m- and p- cresols, xylenol, halogenated phenols, for example, p-chlorophenol and p-bromophenol, and catechol.

The polyimidosiloxane material of the present invention preferably has a high molecular weight and exhibits an intrinsic viscosity (logarithmic viscosity number) of 0.05 to 3, more preferably 0.1 to 2.0, determined at a concentration of 0.5 g/100 ml in a solvent consisting of N-methyl-2-pyrrolidone, at a temperature of 30° C.

Also, the polyimidosiloxane material of the present invention preferably has a degree of imidization of about 90% or more, more preferably 95% to 100%, determined by an infrared absorption spectra analysis method. Also, it is preferable that, in an IR chart of the polyimidosiloxane material of the present invention, substantially no absorption peak which corresponds to an amide-acid bond thereof appears.

The polyimidosiloxane composition of the present invention preferably comprises the above-mentioned polyimidosiloxane resin containing the copolymerized diaminobenzoic acid as a member of the additional diamine ingredient (d), and optionally an epoxy resin in an amount of 1 to 50 parts by weight, preferably 2 to 40 parts by weight, per 100 parts by weight of the polyimidosiloxane material, which materials are uniformly dissolved or dispersed in an organic solvent having a boiling point of from 100° C. to 300° C., preferably from 140° C. to 300° C., more preferably 145° C. to 300° C., still more preferably 150° C. to 280° C.

The epoxy resin usable for the present invention is preferably selected from those having an epoxy equivalent of 100 to 1000 and a molecular weight of 400 to 5000, and are in the state of a liquid or powder. For example, the epoxy resin is selected from bisphenol A - epoxy resins, bisphenol F - epoxy resins, novolak - epoxy resins and polyfunctional glycidylamine - epoxy resins. The novolak - epoxy resins are preferably employed for the composition of the present invention because the resultant coating film layer exhibits an excellent heat resistance.

The organic solvent usable for the polyimidosiloxane material preferably comprises at least one polar organic compound selected from dimethylsulfoxide, diethylsulfoxide, N,N-dimethylformamide, N,N-diethylformamide, N,N-dimethylacetamide N,N-diethylacetamide, N-methyl-2-pyrrolidone, N-ethyl-2-pyrrolidone, N-vinyl-2-pyrrolidone, methyl diglyme, methyl triglyme, dioxane, trioxane, hexamethylenephosphoramide, γ-butyrolactone, cyclohexanone, phenol, o-cresol, m-cresol, p-cresol, xylenols, halogenated phenols and catechol.

The organic solvent may further contain a small amount of xylene or ethyl cellosolve, and the organic solvent for the polyimidosiloxane composition may be the same as the organic solvent used for the production of the polyimidosiloxane resin.

In the polyimidosiloxane composition of the present invention, when the organic solvent having a boiling point of 180° C. or more, preferably 200° C. or more, for example, methyl triglyme, is used, the resultant composition, for example, varnish or a coating liquid, is very stable during storage because the evaporation of the organic solvent at that time is very small. Accordingly, when this type of polyimidosiloxane composition is used to prepare, for example, a printing ink, the roll kneading operation of the printing ink can be smoothly carried out without changing the concentration of the ink, and the resultant printing ink can be smoothly painted, for example, by a silk screen printing method, without difficulty.

The polyimidosiloxane composition of the present invention optionally further comprises at least one additive selected from inorganic fillers, for example, walastnite, silica and talc, organic polymeric fillers, for example, fine polyimide resin powder and inorganic and organic dyes. The additive is preferably present in an amount of 20% or less based on the total weight of the solid components in the composition.

In the polyimidosiloxane composition of the present invention, the polyimidosiloxane resin is preferably present in a concentration of 5 to 50% by weight, more preferably 10 to 40% by weight, based on the total weight of the composition.

Also, in the polyimidosiloxane composition, the polyimidosiloxane resin is preferably present in a dry amount of at least 60% based on the total dry solid weight of the composition.

When the epoxy resin is contained, the total dry amount of the polyimidosiloxane resin and the epoxy resin is preferably at least 60% based on the total dry solid weight of the composition.

The polyimidosiloxane composition of the present invention optionally containing the epoxy resin preferably has a rotation viscosity of 0.01 to 10,000 poises, more preferably 0.1 to 1,000 poises, at a temperature of 25° C.

The polyimidosiloxane composition of the present invention may be a polymerization-imidization product solution prepared by the reaction of the above-mentioned aromatic tetracarboxylic acid component (A) and diamine component (B) in the above-mentioned organic solvent, or a solution of the polymerization-imidization product solution diluted with an additional amount of the organic solvent Alternatively, the polyimidosiloxane composition of the present invention is prepared by evenly dissolving or dispersing a solid polyimidosiloxane resin, and optionally an epoxy resin, in an organic solvent.

The polyimidosiloxane resin of the present invention exhibits not only a high mechanical strength and electrical insulating property but also a high heat resistance and flexibility, and therefore, is useful for forming a protective coating film layer or an interlaminar insulating layer for various flexible materials, especially electric or electronic elements, for example, flexible circuit elements.

In the formation of the protective coating layer, the polyimidosiloxane composition (varnish or coating liquid) of the present invention is applied to surfaces of various electric or electronic elements at room temperature, by a customary coating or printing means, for example, a rotation coating machine, dispenser coating machine or a printing machine, to form a coated composition layer having a uniform thickness, and the resultant composition layer is dried and heat treated at a relatively low temperature of about 50° C. or more, preferably 60° C. to 250° C. The protective coating layer usually has a thickness of 0.5 to 500 μm.

In the method of applying the polyimidosiloxane composition of the present invention to a flexible substrate material, a surface of the flexible substrate material is coated with the polyimidosiloxane composition (varnish or coating liquid) comprising the polyimidosiloxane resin and optionally the epoxy resin dissolved or dispersed in the organic solvent, and, the resultant polyimidosiloxane composition layer is dried at a temperature of 50° C. to 280° C., preferably 60° C. to 260° C., more preferably 100° C. to 250° C., preferably for 0.1 to 10 hours, more preferably 0.2 to 5 hours, to evaporate away the organic solvent and to form a protective coating layer or the flexible substrate material surface.

The flexible substrate material can be selected from flexible electric or electronic elements, especially flexible circuit elements comprising a flexible substrate film and an electroconductive circuits formed on the flexible substrate film and the polyimidosiloxane composition is applied to the upper and side surfaces of the electroconductive circuits.

The resultant protective resinous layer from the polyimidosiloxane composition is flexible, and thus does not cause a curling of the coated circuit element.

In the circuit elements, the flexible substrate film comprises a member selected from heat-resistant flexible polymeric materials, aromatic polyimide resins, aromatic polyamide resins, and aromatic polyester resins, and heat-resistant inorganic materials, for example, metal foils.

The electroconductive circuits are usually composed of thin lines formed from a metal foil, for example, a copper foil, having a thickness of 10 to 500 μm, preferably 30 to 300 μm and arranged at intervals of 10 to 500 μm, preferably 50 to 400 μm.

When the polyimidosiloxane composition is applied in accordance with the method of the present invention, the resultant polyimidosiloxane-coated flexible material comprises a flexible substrate material and a protective coating layer comprising the polyimidosiloxane resin, and optionally an epoxy resin. The protective coating layer preferably has a thickness of 0.5 to 200 μm, more preferably 1 to 100 μm.

The resultant protective coating layer has a high flexibility, an initial modulus of elasticity of 5 to 70 kg/mm$^2$, a tensile strength of about 0.5 to 20 kg/mm$^2$, and an ultimate elongation of 30 to 500% at a temperature of 25° C. Also, this protective coating layer has a high heat resistance represented by a thermodecomposing temperature of about 250° C. to 500° C., and by a resistance to soldering at a temperature of 240° C. for 30 seconds.

EXAMPLES

The present invention will be further explained by the following specific examples.

In the examples, the following measurements were carried out.

(1) Solubility of Polyimidosiloxane Resin

A polyimidosiloxane resin powder in an amount of 0.2 g was mixed into 0.8 g of methyl diglyme at a temperature of 20° C., and the mixture was left to stand to thereby allow the resin powder to be dissolved in methyl diglyme. The solubility of the polyimidosiloxane was evaluated and classified as follows.

| Class | Solubility |
|-------|------------|
| 4 | Completely dissolved within one hour |
| 3 | Completely dissolved within one day but longer than one hour |
| 2 | A portion of the resin powder was swollen |
| 1 | The resin powder was not completely dissolved after one week |

(2) Thermodecomposing Temperature of Polyimidosiloxane Resin

This temperature was determined by using a thermogravimeter (trademark: Du Pont Thermogravimeter 951).

(3) Mechanical Strength of Polyimidosiloxane Resin

A solution of a polyimidosiloxane resin in an amount of 30% by weight in methyl diglyme solvent was spread on an area of a horizontal polytetrafloroethylene (PTFE) plate framed by spacers having a thickness of 200 μm and arranged on the PTFE plate, and the resultant solution layer was dried and heat treated at a temperature of 80° C. for 30 minutes, then at a temperature of 150° C. for 30 minutes, and finally, at a temperature of 200° C. for 30 minutes, to form a polyimidosiloxane resin film having a thickness of about 50 μm.

The tensile strength, ultimate elongation and initial modulus of elasticity of the resultant film were measured by using a tensile strength tester (trademark: TENSILON UTM-11-20, made by DRIENTIC CO.).

(4) Curling Test of Coated Flexible Film

The same solution of the polyimidosiloxane resin as mentioned above was spread on an area on a surface of an aromatic polyimide resin film (trademark: UPILEX S-75, made by UBE INDUSTRIES, LTD.) having a thickness of 75 μm, framed by polyethylene terephthalate spacers having a thickness of 100 μm and arranged on the film surface, by using a coating rod (bar), and the resultant resin solution layer was dried and heat treated in the same manner as mentioned above. The resultant resin film had an average thickness of 40 μm.

The coated film was cut to a length of 100 mm and a width of 50 mm, and then a radius of a curled surface of the cut film was measured.

(5) Curling Test of Coated Flexible Circuit Film

A test piece having a length of 5 cm and a width of 3 cm was placed on a horizontal test surface and the heights of two longitudinal ends of the test piece from the horizontal test surface were measured in mm. The degree of curling of the test piece was represented by an average value of the measured heights.

(6) Bonding Strength

A bonding strength of a coated polyimidosiloxane resin film layer to a circuit film was measured by a customary cross-cut test, and expressed by a percentage of the total area of non-peeled portions of the film layer, based on the entire area of the film layer.

(7) Heat Resistance of a Coated Polyimidosiloxane Resin Film Layer

This heat resistance was measured by immersing a polyimidosiloxane resin-coated circuit film in solder at a temperature of 240° C. for 30 seconds, and observing the conditions of the polyimidosiloxane resin coating film layer.

EXAMPLE 1

(1) A Preparation of a Polyimidosiloxane

A glass separable flask having a capacity of 2 liters was charged with 147.2 g (500 m moles) of 2,3,3',4'-biphenyltetracarboxylic dianhydride (a-BPDA) and 1274 g of N-methyl-2-pyrrolidone (NMP) and a-BPDA was dissolved in NMP in the flask.

While stirring the a-BPDA solution at room temperature in the flask, a solution of 304.9 g (346.5 m moles) of diaminosiloxane (DAPS) of the formula (I), which was available under the trademark of X-22-161AS from Shinetsu Silicone Co. and in which $R_1$ is a —$(CH_2)_3$— group, $R_2$ is a methyl group and n is an integer of 9, in 540 g of methyl diglyme, was added to the a-BPDA solution over a time of 30 minutes, and the resultant polymerization mixture was heated at a temperature of 190° C. for 3 hours, while flowing a nitrogen gas through the flask to reflux methyl diglyme and remove a by-product consisting of water, and the polymerization mixture was then cooled to room temperature. To the cooled polymerization mixture was dropwise added a solution of 62.19 g (151.25 m moles) of 2,2-bis[4-(4-aminophenoxy)phenyl]propane (BAPP) in 500 g of NMP at room temperature over a time of 30 minutes, and the resultant admixture was heated at a temperature of 200° C. to 210° C. over a time of 6 hours, while stirring the resultant polymerization mixture, to prepare a polyimidosiloxane resin.

Then, to the resultant polymerization mixture was added 20 liters of methyl alcohol, to cause the resultant polyimidosiloxane resin to be precipitated over a time of 30 minutes by using a disperser. The precipitated polyimidosiloxane resin was then collected by a filtration.

The collected polyimidosiloxane resin powder was washed twice in 10 liters of methyl alcohol for 10 minutes, using a disperser, and the washed resin powder then dried under a vacuum at a temperature of 60° C., for 8 hours.

The polyimidosiloxane resin powder was obtained in an amount of 428.9 g.

This polyimidosiloxane resin had an intrinsic viscosity of 0.24 at 30° C. and a degree of imidization of substantially 100%.

(2) Preparation of Polyimidosiloxane Composition

A polyimidosiloxane composition containing 35% by weight of a polyimidosiloxane resin was prepared by uniformly dissolving 3.5 g of the polyimidosiloxane resin as mentioned above in 6.5 g of methyl diglyme at room temperature.

This polyimidosiloxane composition had a rotation viscosity of 3500 centipoises at 25° C.

(3) Coating of a Flexible Circuit Film with a Polyimidosiloxane Composition

The above-mentioned polyimidosiloxane composition was coated on an area of a surface of a flexible circuit film composed of an aromatic polyimide substrate film, which was available under the trademark of UPILEX S-75 from UBE INDUSTRIES LTD. and had a thickness of 75 μm, and circuit lines formed on the polyimide substrate film, having a width of about 300 μm of the circuit lines and a circuit line-arranging density of 60% or more, which area was defined by spacers made of a polyethylene terephthalate resin and having a thickness of 100 μm, by a bar coating method and by using a laboratory coating rod No. 3.

The resultant coated polyimidosiloxane composition layer was dried and heat-treated at a temperature of 80° C. for 30 minutes, then at 150° C. for 30 minutes, and finally, at 180° C. for 30 minutes, to form a protective polyimidosiloxane coating film layer having an average thickness of 40 μm.

The resultant coated flexible circuit film was substantially not curled by the protective film layer. The protective film layer had a very high bonding strength of 100% to the circuit film, as determined by the cross-cut test.

Also, it was confirmed that the resultant coated circuit film was substantially free from curling and had a radius of the curled surface of about 100 mm or more, and a satisfactory heat resistance.

EXAMPLES 2 TO 4 AND COMPARATIVE EXAMPLES 1 TO 4

In each of Examples 2 to 4 and Comparative Examples 1 to 4, the same procedures as in Example 1 were carried out except that the aromatic tetracarboxylic acid component (A) and the diamine component (B) consisted of the compounds of the type and in the amounts as shown in Table 1. The degree of imidization of the resultant polyimidosiloxane resin was 95% or more. The resultant polyimidosiloxane had the properties (intrinsic viscosity, thermodecomposing temperature and solubility) as indicated in Table 1.

The polyimidosiloxane resin was dissolved in a concentration of 40% by weight in methyl diglyme.

The rotation viscosity and curling property of the resultant polyimidosiloxane composition are shown in Table 1.

TABLE 1

| Item | Preparation of polyimidosiloxane resin | | | | | Properties of polyimidosiloxane resin | | | Properties of polyimidosiloxane composition | |
|---|---|---|---|---|---|---|---|---|---|---|
| | Aromatic tetra-carboxylic acid component | | Diamine component | | | | | | | Curling test |
| Example No. | Type | Amount (g) (m.mol) | BAPP (g) | DAPS (x-22-161AS) (g) | Molar ratio BAPP/DAPS | Type of resin | Intrinsic viscosity (25° C.) | Thermo-decomposing temperature (°C.) | Solu-bility | Rotation viscosity (25° C.) (CP) | Radius of curled surface (mm) |
| Example | | | | | | | | | | | |
| 1 | a-BPDA | 147.2 (500 m mol) | 62.19 (151.5 m mol) | 304.9 (346.5 m mol) | About 3/7 | A | 0.24 | 363 | 4 | 3500 | Not curled |
| 2 | a-BPDA | 147.2 (500 m mol) | 102.63 (250 m mol) | 220.0 (250 m mol) | About 5/5 | B | 0.30 | 397 | 4 | 4100 | 25.6 |
| 3 | a-BPDA | 147.2 (500 m mol) | 82.10 (200 m mol) | 264.0 (300 m mol) | About 4/6 | C | 0.23 | 382 | 4 | 3800 | Not curled |
| 4 | a-BPDA | 147.2 (500 m mol) | 51.31 (125 m mol) | 330.0 (375 m mol) | About 2.5/7.5 | D | 0.22 | 324 | 4 | 3000 | Not curled |
| Comparative Example | | | | | | | | | | | |
| 1 | PMDA | 109.1 (500 m mol) | 61.58 (150 m mol) | 308.0 (350 m mol) | About 3/7 | E | — | — | 1 | | Could not be measured |
| 2 | BTDA | 644.46 (500 m mol) | 61.58 (150 m mol) | 308.0 (350 m mol) | About 3/7 | F | — | — | 1 | | Could not be measured |
| 3 | a-BPDA | 147.2 (500 m mol) | 61.58 (500 m mol) | — (0 m mol) | About 10/0 | G | 0.52 | 475 | 2 | — | 11.2 |
| 4 | a-BPDA | 147.2 (500 m mol) | 184.73 (450 m mol) | 44.0 (50 m mol) | About 9/1 | H | 0.33 | 425 | 2 | — | 9.8 |

Note:
a-BPDA ... 2,3,3',4'-diphenyltetracarboxylic dianhydride
PMDA ... Pyromellitic dianhydride
BTDA ... 3,4,3',4'-benzophenonetetracarboxylic dianhydride
BAPP ... 2,2-bis[4-(4-aminophenoxy)phenyl]benzene
DAPS ... Diaminopolysiloxane (X-22-161AS)

In Table 1, the polyimidosiloxane resins E and F in Comparative Examples 1 and 2 were substantially insoluble in the organic solvent, for example, NMP or dioxane, and therefore, could not be converted to a polyimidosiloxane composition.

The polyimidosiloxane resins G and H in Comparative Examples 3 and 4 exhibited a poor solubility in methyl diglyme, and thus were dissolved in NMP to prepare polyimidosiloxane compositions.

Each of the polyimidosiloxane compositions of Examples 2 to 4 and Comparative Examples 3 and 4 were applied to the same flexible circuit film as mentioned in Example 1, and in the same manner as in Example 1, to form a protective coating film layer having an average thickness of about 30 to 40 μm.

The resultant coated flexible circuit films of Examples 2 to 4 were substantially not curled, whereas the coated flexible films of Comparative Examples 3 and 4 were significantly curled.

The polyimidosiloxane resin coating film layer had the properties as indicated in Table 2.

EXAMPLE 5

The same procedures as in Example 1 were carried out with the following exceptions.

In the preparation of the polyimidosiloxane composition from the polyimidosiloxane resin (A) as shown in Table 1, the methyl diglyme was replaced by methyl triglyme having a boiling point of 216° C. The resultant polyimidosiloxane composition had a rotation viscosity of 4,000 centipoises at 25° C.

The polyimidosiloxane film prepared from the composition had a radius of a curled surface of 100 mm or more, and thus was substantially free from curling.

The polyimidosiloxane composition was printed on a flexible circuit film having a number of perforations, by a screen printing method using a 200 mesh stainless steel screen having a screen thickness of 81 μm and a membrane thickness of 16 μm, and the printed composition layer was dried and heat treated at a temperature of 80° C. for 30 minutes, then at a temperature of 150° C. for 30 minutes, and finally, at a temperature of 200° C. for 30 minutes. The resultant printed protective film layer had an average thickness of about 40 μm.

The screen printing operation was smoothly carried out, and the resultant coated circuit film was substantially free from curling, and the protective coating film layer was firmly bonded to the flexible circuit film.

The protective coating film layer had the properties as shown in Table 2.

TABLE 2

| Item | Polyimidosiloxane composition | | | | | | Protective coating film layer | | | |
|---|---|---|---|---|---|---|---|---|---|---|
| | Polyimidosiloxane resin | | Epoxy resin | | Organic polar solvent | | | Mechanical properties | | |
| | Type | Amount (g) | Type | Amount (g) | Type | Amount (g) | Thickness (μm) | Tensile strength (kg/mm²) | Ultimate elongation (%) | Initial modulus of elasticity (kg/mm²) |
| Example | | | | | | | | | | |
| 1 | A | 35 | — | 0 | Methyl diglyme | 65 | 40 | 2.0 | 509 | 25 |
| 2 | B | 35 | — | 0 | Methyl diglyme | 65 | 40 | 2.3 | 105 | 65 |
| 3 | C | 35 | — | 0 | Methyl diglyme | 65 | 60 | 0.9 | 73 | 38 |
| 4 | D | 35 | — | 0 | Methyl diglyme | 65 | 60 | 0.9 | 416 | 6 |
| 5 | A | 35 | — | 0 | Methyl triglyme | 65 | 55 | 2.1 | 511 | 24 |
| Comparative Example | | | | | | | | | | |
| 3 | G | 35 | — | 0 | N-methyl-2-pyrrolidone | 65 | 50 | 8.4 | 51 | 220 |
| 4 | H | 35 | — | 0 | N-methyl-2-pyrrolidone | 65 | 45 | 7.2 | 59 | 177 |
| Example | | | | | | | | | | |
| 6 | I | 30 | Novolak-epoxy | 5.4 | Methyl diglyme | 40 | 50 | 2.1 | 156 | 38 |
| 7 | J | 30 | Novolak-epoxy | 10.8 | Methyl diglyme | 40 | 45 | 2.3 | 140 | 39 |
| 8 | K | 30 | Novolak-epoxy | 2.7 | Methyl diglyme | 40 | 52 | 2.2 | 145 | 38 |
| 9 | L | 30 | Novolak-epoxy | 5.4 | Methyl diglyme | 40 | 53 | 2.4 | 136 | 40 |
| 10 | M | 30 | Novolak-epoxy | 10.8 | N-methyl-2-pyrrolidone | 40 | 32 | 4.8 | 70 | 55 |

| | Coated circuit film | | |
|---|---|---|---|
| | Curing property (height) (mm) | Bonding strength (cross cut test) (%) | Soldering heat resistance |
| Example | | | |
| 1 | ≦1 mm | 100 | Satisfactory |
| 2 | ≦2 mm | 100 | Satisfactory |
| 3 | ≦1 mm | 100 | Satisfactory |
| 4 | ≦1 mm | 100 | Satisfactory |
| 5 | ≦1 mm | 100 | Satisfactory |
| Comparative Example | | | |
| 3 | ≧5 mm | 100 | Satisfactory |
| 4 | ≧5 mm | 100 | Satisfactory |
| Example | | | |
| 6 | ≦1 mm | 100 | Satisfactory |
| 7 | ≦1 mm | 100 | Satisfactory |
| 8 | ≦1 mm | 100 | Satisfactory |
| 9 | ≦1 mm | 100 | Satisfactory |
| 10 | ≦2 mm | 100 | Satisfactory |

EXAMPLE 6

(1) A Preparation of a Polyimidosiloxane

A glass separable flask having a capacity of 2 liters was charged with 14.71 g (50 m moles) of 2,3,3',4'-biphenyltetracarboxylic dianhydride (a-BPDA) and 100 g of N-methyl-2-pyrrolidone (NMP) and a-BPDA was dissolved in NMP in the flask.

While stirring the a-BPDA solution at room temperature in the flask, a solution of 30.803 g (35 m moles) of diaminosiloxane (DAPS) of the formula (I), which was available under the trademark of X-22-161AS from Shinetsu Silicone Co. and in which $R_1$ is a —($CH_2$)$_3$— group, $R_2$ is a methyl group and n is an integer of 9, in 100 g of methyl diglyme, was added to the a-BPDA solution over a time of 30 minutes, and the resultant polymerization mixture was heated at a temperature of 190° C. for 4 hours, while flowing a nitrogen gas through the flask to reflux methyl diglyme, and to remove a by-product consisting of water, and the polymerization mixture was then cooled to room temperature. To the cooled polymerization mixture was dropwise added a solution of 3.078 g (7.5 m moles) of 2,2-bis[4-(4-aminophenoxy)phenyl]propane (BAPP) and 1.411 g (7.5 m moles) of 3,5-diaminobenzoic acid in 47.5 g of NMP at room temperature over 30 minutes, and the admixture was heated at a temperature of 200° C. to 210° C. over a time of 3 hours, while stirring the resultant polymerization mixture, to prepare a polyimidosiloxane resin.

To the resultant polymerization mixture was added an amount of 20 liters of methyl alcohol to cause the resultant polyimidosiloxane resin to be precipitated over a time of 30 minutes by using a disperser, and the precipitated polyimidosiloxane resin was collected by a filtration.

The collected polyimidosiloxane resin powder was washed twice in 10 liters of methyl alcohol for 10 minutes, using a disperser, and the washed resin powder then dried under a vacuum at a temperature of 60° C. for 8 hours.

The polyimidosiloxane resin powder was collected in an amount of 43.87 g and an yield of 92% by weight.

This polyimidosiloxane resin (I) had an intrinsic viscosity of 0.18 at 30° C. and a degree of imidization of substantially 100%. The properties of the polyimidosiloxane resin are shown in Table 3.

(2) Preparation of Polyimidosiloxane-Epoxy Resin Composition

A polyimidosiloxane composition was prepared by uniformly dissolving 30 g of the polyimidosiloxane resin (I) and 5.4 g of a Novolak-epoxy resin (trademark: Epoxy 157S70, made by Yuka Shell Co.) in 40 g of methyl diglyme at room temperature. The total resin concentration of the resultant resin composition was 47% by weight.

This polyimidosiloxane composition had a rotation viscosity of 4400 centipoises at 25° C. A film formed from the resin composition had a radius of a curled surface of 100 mm or more, and thus was substantially free from curling.

The properties of the resin composition are shown in Tables 2 and 3.

(3) Coating of a Flexible Circuit Film with a Polyimidosiloxane-Epoxy Resin Composition The above-mentioned polyimidosiloxane-epoxy resin composition was coated on an area of a surface of a flexible circuit film composed of an aromatic polyimide substrate film which was available under the trademark of UPILEX S-75 from UBE INDUSTRIES LTD. and had a thickness of 75 μm and circuit lines formed on the polyimide substrate film, having a circuit line thickness of about 300 μm and a circuit line-arranging density of 60% or more, which area was defined by spacers made of a polyethylene terephthalate resin and having a thickness of 100 μm, by a bar coating method and by using a laboratory coating rod No. 3.

The resultant coated polyimidosiloxane composition layer was dried and heat-treated at a temperature of 80° C. for 30 minutes, then at 150° C. for 30 minutes, and finally, at 180° C. for 30 minutes, to form a protective polyimidosiloxane coating film layer having an average thickness of 65 μm.

The resultant coated circuit film was substantially not curled by the protective film layer. The protective film layer had a very high bonding strength of 100% (cross cut test) to the circuit film.

Also, it was confirmed that the resultant coated circuit film was substantially free from curling and had a radius of the curled surface of about 100 mm or more, and a satisfactory heat resistance. The properties of the coated circuit film are shown in Table 2.

EXAMPLES 7 TO 10

In each of Examples 7 to 10, the same procedures as in Example 6 were carried out except that the aromatic tetracarboxylic acid component (A) and the diamine component (B) consisted of the compounds of the type and in the amounts as shown in Table 3. The degree of imidization of the resultant polyimidosiloxane resin was 95% or more. The resultant polyimidosiloxane had the properties (intrinsic viscosity, thermodecomposing temperature and solubility) as indicated in Table 3.

The polyimidosiloxane-epoxy resin composition was prepared in the same manner as in Example 6, except that the composition of the resin composition was as indicated in Table 3.

In Example 10, the resultant polyimidosiloxane resin (M) had a very poor solubility in methyl diglyme and dioxane. Therefore, in Example 10, the polyimidosiloxane-epoxy resin composition was prepared by using N-methyl-2-pyrrolidone (NMP) in place of methyl diglyme.

The properties of the polyimidosiloxane-epoxy resin composition and the protective coating film layer, and the coated circuit film prepared from the composition, are shown in Tables 2 and 3.

TABLE 3

| | Components of polyimidosiloxane resin | | | | | | | |
|---|---|---|---|---|---|---|---|---|
| | Aromatic tetra-carboxylic acid component | | Diamine component | | | Properties of polyimidosiloxane resin | | | |
| Example No. | Type | Amount (g) | (x-22-161AS) (g) | BAPP (g) | DABA(*)$_2$ (g) | Type of resin | Intrinsic viscosity | Thermal decomposing temperature | Solubility in methyl diglyme (°C.) |
| Example | | | | | | | | | |
| 6 | a-BPDA | 14.711 (50 m mol) | 30.803 (35.0 m mol) | 3.078 (7.5 m mol) | 1.1411 (7.5 m mol) | I | 0.18 | 356 | 4 |
| 7 | a-BPDA | 14.711 (50 m mol) | 30.803 (35.0 m mol) | 3.078 (7.5 m mol) | 1.1411 (7.5 m mol) | J | 0.18 | 355 | 4 |
| 8 | a-BPDA | 14.711 (50 m mol) | 30.803 (35.0 m mol) | 4.105 (10.0 m mol) | 0.761 (5.00 m mol) | K | 0.22 | 345 | 4 |

TABLE 3-continued

| 9 | a-BPDA | 14.711 (50 m mol) | 30.803 (35.0 m mol) | 4.105 (10.0 m mol) | 0.761 (5.00 m mol) | L | 0.22 | 343 | 4 |
| 10 | a-BPDA | 14.711 (50 m mol) | 30.803 (35.0 m mol) | 0.00 (0.0 m mol) | 2.282 (15.0 m mol) | M | 0.23 | 375 | 1(*)1 |

| | Component of polyimidosiloxane-epoxy resin composition | | | Properties of polyimidosiloxane-epoxy resin composition | | |
|---|---|---|---|---|---|---|
| | Polyimido-siloxane resin (g) | Epoxy resin (g) | Methyl diglyme (g) | Rotation viscosity (25° C.) (CP) | Curling property | Soldering heat resistance (240° C. 30 sec) |
| Example | | | | | | |
| 6 | 30 | 5.4 | 40 | 4400 | Not curled | Very good |
| 7 | 30 | 10.8 | 40 | 4800 | Not curled | Very good |
| 8 | 30 | 2.7 | 40 | 4900 | Not curled | Good |
| 9 | 30 | 5.4 | 40 | 5100 | Not curled | Good |
| 10 | 30 | 10.8 | 40 (NMP) | 5500 (NMP) | Not curled | Good |

Note:
(*)1 . . . This polyimidosiloxane resin was soluble in NMP.
(*)2 . . . 3,5-diaminobenzoic acid

We claim:

1. A polyimidosiloxane resin composition comprising:
(I) a polyimidosiloxane resin comprising a polymerization-imidization product of:
(A) an aromatic tetracarboxylic acid component comprising:
(a) 80 to 100 molar % of a principal acid ingredient consisting of at least one member selected from the group consisting of 2,3,3',4'-biphenyltetracarboxylic acid and dianhydrides and esters thereof; and
(b) 0 to 20 molar % of an additional acid ingredient consisting of at least one member selected from the group consisting of aromatic tetracarboxylic acids different from 2,3,3',4'-biphenyltetracarboxylic acid and dianhydrides and esters thereof; and
(B) a diamine component comprising:
(c) 45 to 90 molar % of a principal diamine ingredient consisting of at least one diaminopolysiloxane compound of the formula (I):

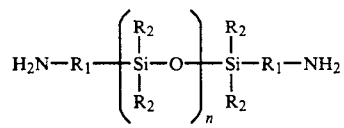

wherein $R_1$ represents a divalent hydrocarbon residue, $R_2$ represents a member selected from alkyl groups having 1 to 3 carbon atoms and a phenyl group, and n represents an integer of from 3 to 30; and
(d) 10 to 55 molar % of an additional diamine ingredient comprising 55 to 99.5 molar % of at least one aromatic diamine compound having a plurality of benzene ring structures and different from the diaminopolysiloxane compound of formula (I), and 0.5 to 45 molar % of at least one diaminobenzoic acid, based on the total molar amount of the additional diamine ingredient (d);
and
(II) an epoxy resin having an epoxy equivalent of 100 to 1000 and a molecular weight of 400 to 5000, in an amount of 1 to 50 parts by weight per 100 parts by weight of the polyimidosiloxane resin, the polyimidosiloxane resin and the epoxy resin being dissolved or dispersed in an organic solvent having a boiling point of from 100° C. to 300° C.

2. The polyimidosiloxane resin composition as claimed in claim 1, wherein the epoxy resin comprises at least one member selected from the group consisting of bisphenyl A-epoxy resins, bisphenol F-epoxy resins, novolak-epoxy resins and polyfunctional glycidylamine-epoxy resins.

3. The polyimidosiloxane resin composition as claimed in claim 1, wherein the additional acid ingredient (b) of the aromatic tetracarboxylic acid component (A) comprises at least one member selected from the group consisting of 3,3',4,4'-biphenyltetracarboxylic acid, 3,3',4,4'-benzophenonetetracarboxylic acid, 3,3',4,4'-biphenylethertetracarboxylic acid, pyromellitic acid and dianhydrides and esters of the above-mentioned acids.

4. The polyimidosiloxane resin composition as claimed in claim 1, wherein the diaminopolysiloxane compound of the formula (I) is selected from the group consisting of the formulae:

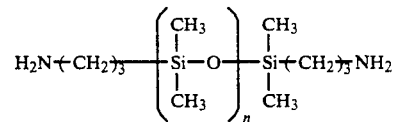

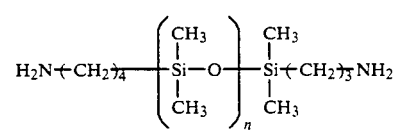

-continued

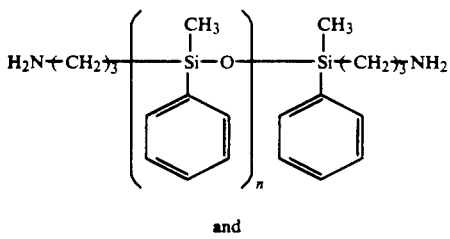

and

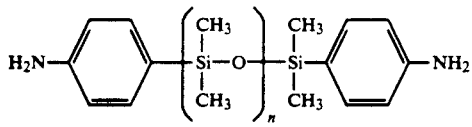

wherein n is as defined above.

5. The polyimidosiloxane resin composition as claimed in claim 1, wherein the aromatic diamine compound having a plurality of benzene ring structures of the additional diamine ingredient (d) is selected from the group consisting of 4,4'-diaminodiphenylether, 4,4'-diaminodiphenylmethane, 4,4'-diaminodiphenylsulfon, o-tolidine, o-dianisidine, 1,4-bis(4-aminophenoxy)benzene, 1,4-bis(4-aminophenyl)benzene, bis(4-(4-aminophenoxy)phenyl)sulfon and 2,2-bis(4-(4-amino-phenoxy)phenyl)propane.

6. The polyimidosiloxane resin composition as claimed in claim 1, wherein the additional diamine ingredient (d) of the diamine component (B) comprises 0.5 to 25 molar %, based on the total molar amount of the diamine component (B), of at least one diaminobenzoic acid and the balance consisting of at least one aromatic diamine compound having a plurality of benzene rings structure.

7. The polyimidosiloxane resin composition as claimed in claim 1, wherein the diaminobenzoic acid in the additional diamine ingredient is selected from the group consisting of 3,5-diaminobenzoic acid and 2,6-diaminobenzoic acid.

8. The polyimidosiloxane resin composition as claimed in claim 1, wherein the aromatic diamine compound having a plurality of benzene rings structure in the additional diamine ingredient is selected from the group consisting of 4,4'-diaminodiphenylether, 4,4'-diaminodiphenylmethane, 4,4'-diaminodiphenylsulfon, o-tolidine, o-dianisidine, 1,4-bis(4-aminophenoxy)benzene, 1,4-bis(4-aminophenyl)benzene, bis[4-(4-aminophenoxy)phenyl]sulfon, and 2,2-bis[4-(4-aminophenoxy)phenyl)propane.

9. The polyimidosiloxane resin composition as claimed in claim 1, wherein the additional diamine ingredient (d) of the diamine component (B) further comprises 10 molar % or less, based on the total molar amount of the additional diamine ingredient (d), of at least one aromatic diamine compound having only one benzene ring structure and different from diaminobenzoic acid.

10. The polyimidosiloxane resin composition as claimed in claim 1, wherein the aromatic diamine compound having only one benzene ring structure and different from diaminobenzoic acid is selected from the group consisting of p-phenylene diamine, m-phenylene diamine and 2,4-diaminotoluene.

11. The polyimidosiloxane resin composition as claimed in claim 1, which has an intrinsic viscosity of 0.05 to 3 determined at a concentration of 0.5 g/100 ml in N-methyl-2-pyrrolidone at a temperature of 30° C.

12. The polyimidosiloxane resin composition as claimed in claim 1, which has a degree of imidization of about 90% or more, determined by an infrared absorption spectra analysis method and in an IR chart of which substantially no absorption peak corresponding to an amide-acid bond thereof appears.

13. The polyimidosiloxane composition as claimed in claim 1, wherein the organic solvent comprises at least one member selected from the group consisting of dimethylsulfoxide, diethylsulfoxide, N,N-dimethylformamide, N,N-diethylformamide, N,N-dimethylacetamide, N,N-diethylacetamide, N-methyl-2-pyrrolidone, N-ethyl-2-pyrrolidone, N-vinyl-2-pyrrolidone, methyl diglyme, methyl triglyme, dioxane, trioxane, hexamethylenephosphoramide, γ-butyrolactone, cyclohexanone, phenol, o-cresol, m-cresol, p-cresol, xylenols, halogenated phenols and catechol.

14. The polyimidosiloxane composition as claimed in claim 1, which further comprises at least one additive selected from the group consisting of inorganic fillers, polymeric fillers and inorganic and organic dyes, in an amount of 20% or less based on the total weight of the solid components in the composition.

15. The polyimidosiloxane composition as claimed in claim 1, wherein the polyimidosiloxane material is present in a dry weight of at least 60% by weight based on the total dry solid weight of the composition.

16. The polyimidosiloxane composition as claimed in claim 1, wherein the total dry weight of the polyimidosiloxane material and the epoxy resin is at least 60% based on the total dry solid weight of the composition.

17. The polyimidosiloxane composition as claimed in claim 1, in which the polyimidosiloxane resin is present in a concentration of 5 to 50% by weight.

18. The polyimidosiloxane composition as claimed in claim 1, which has a rotation viscosity of 0.01 to 10,000 poises at a temperature of 25° C.

* * * * *

UNITED STATES PATENT AND TRADEMARK OFFICE
CERTIFICATE OF CORRECTION

PATENT NO. : 5,252,703
DATED : October 12, 1993
INVENTOR(S) : Kohei NAKAJIMA et al.

It is certified that error appears in the above-indentified patent and that said Letters Patent is hereby corrected as shown below:

Claim 4, col. 18, line 52, after "of", insert --   compounds of--.

Signed and Sealed this

Seventeenth Day of May, 1994

*Attest:*

BRUCE LEHMAN

*Attesting Officer*   *Commissioner of Patents and Trademarks*